(12) United States Patent
Mahler et al.

(10) Patent No.: US 7,777,352 B2
(45) Date of Patent: Aug. 17, 2010

(54) SEMICONDUCTOR DEVICE WITH SEMICONDUCTOR DEVICE COMPONENTS EMBEDDED IN PLASTIC PACKAGE COMPOUND

(75) Inventors: Joachim Mahler, Regensburg (DE); Seow Mun Tang, Singapore (SG)

(73) Assignee: Infineon Technologies AG, Neubiberg (DE)

( * ) Notice: Subject to any disclaimer, the term of this patent is extended or adjusted under 35 U.S.C. 154(b) by 102 days.

(21) Appl. No.: 11/543,315

(22) Filed: Oct. 5, 2006

(65) Prior Publication Data

US 2007/0200258 A1    Aug. 30, 2007

(30) Foreign Application Priority Data

Oct. 5, 2005    (DE) ........................ 10 2005 047 856

(51) Int. Cl.
   *H01L 23/48* (2006.01)
   *H01L 23/495* (2006.01)

(52) U.S. Cl. ................. 257/784; 257/666; 257/787; 257/790; 257/E23.024

(58) Field of Classification Search ........... 257/783, 257/787, 666, 790, 784, E23.024
   See application file for complete search history.

(56) References Cited

U.S. PATENT DOCUMENTS

| | | | |
|---|---|---|---|
| 4,814,943 A | 3/1989 | Okuaki | |
| 5,122,858 A | 6/1992 | Mahulikar et al. | |
| 5,536,970 A * | 7/1996 | Higashi et al. | 257/676 |
| 5,554,569 A | 9/1996 | Ganesan et al. | |
| 6,013,109 A | 1/2000 | Choi | |
| 6,118,183 A * | 9/2000 | Umehara et al. | 257/783 |
| 6,638,790 B2 * | 10/2003 | Minamio et al. | 438/111 |
| 6,744,133 B2 | 6/2004 | Tanabe et al. | |
| 2002/0089069 A1 | 7/2002 | Lamson et al. | |
| 2003/0017635 A1 | 1/2003 | Apen et al. | |
| 2006/0043607 A1 * | 3/2006 | Matsuura et al. | 257/782 |

FOREIGN PATENT DOCUMENTS

| | | |
|---|---|---|
| DE | 10124047 A1 | 11/2002 |
| DE | 10250541 B3 | 4/2004 |
| EP | 0665592 A1 | 8/1995 |
| EP | 1006575 A2 | 6/2000 |
| JP | 63135452 A | 6/1988 |
| WO | WO 2004/000966 A1 | 12/2003 |
| WO | WO 2005/071741 A2 | 8/2005 |

* cited by examiner

*Primary Examiner*—Nitin Parekh
(74) *Attorney, Agent, or Firm*—Edell, Shapiro & Finnan, LLC

(57) ABSTRACT

A semiconductor device includes semiconductor device components embedded in plastic package compound, with a buffer layer being arranged on surfaces of the semiconductor device components of the semiconductor device. The buffer layer includes a thermoplastic material.

27 Claims, 2 Drawing Sheets

SEMICONDUCTOR DEVICE WITH SEMICONDUCTOR DEVICE COMPONENTS EMBEDDED IN PLASTIC PACKAGE COMPOUND

CROSS REFERENCE TO RELATED APPLICATIONS

This application claims priority under 35 U.S.C. §119 to Application No. DE 102005047856.5 filed on Oct. 5, 2005, entitled "Semiconductor Device with Semiconductor Device Components Embedded in Plastic Package Compound," the entire contents of which are hereby incorporated by reference.

FIELD

The invention relates to a semiconductor device including semiconductor device components embedded in plastic package compound.

BACKGROUND

The operability and reliability of semiconductor devices are typically tested after production. This process may result in cracking and even in delamination at the boundaries between the various materials of the semiconductor device due to increased temperatures. In particular, cracking between the circuit carrier and the plastic package compound is a problem.

Inadequate adhesion between a system carrier and the plastic package compound in semiconductor devices results in moisture collecting in the boundary layer between the system carrier and the plastic package compound. This moisture expands abruptly when the semiconductor device is heated from room temperature to temperatures of up to 260° C. in a very short time (e.g., during soldering onto a printed circuit board). The abrupt expansion in the moisture content results in cracks and/or fractures in the plastic package of the semiconductor device, often referred to as the "popcorn effect".

To prevent this popcorn effect, moisture must be prevented from collecting in the boundary layer between the semiconductor device components and the plastic package compound. The collection of moisture can be reduced by improving the adhesion between the surfaces of the semiconductor device components and the surface of the plastic package compound. Various approaches are known for improving this adhesion.

U.S. Pat. No. 5,554,569 discloses a method for mechanically roughening the surface of a flat conductor frame. The roughened surface allows interlocking with the plastic package compound and hence better adhesion. However, this method is difficult and costly to perform.

It is also known to put an adhesion promoter on the system carrier prior to assembly. In U.S. Pat. No. 5,122,858, a polymer layer is put on a flat conductor frame.

German Patent Document No. DE 101 24 047 discloses an electronic device with semiconductor chips and system carriers, and also methods for producing same, where a metal system carrier has an electrodeposited adhesive layer comprising metal oxides, particularly of the metals zinc and chromium, to form a dendritic morphology. This device and the production method have the drawback that a dendritic morphology of this kind can be produced by electrodeposition exclusively on metal surfaces, which means that this adhesion promoter layer cannot be produced for semiconductor device components, such as system carriers made of ceramic or printed circuit board material, without prior coating with a shorting but metallically conductive layer.

There is also a need for improved reliability in the case of "green" devices, which need to meet the future requirements of environmental laws. In particular, the use of lead-free solder is desired. However, lead-free solder has the drawback that a higher soldering temperature of 260° C. is required. Consequently, cracking is a particular problem in the case of "green" devices.

SUMMARY

The present invention provides a semiconductor device including semiconductor device components, where the semiconductor device components have a reliable level of adhesion to a plastic package compound surrounding them.

In accordance with the present invention, a semiconductor device comprises semiconductor device components embedded in plastic package compound. The surfaces of the semiconductor device components at least in part include a buffer layer which is arranged between the semiconductor device components and the plastic package housing. The buffer layer at least in part comprises a thermoplastic material.

The above and still further features and advantages of the present invention will become apparent upon consideration of the following detailed description of specific embodiments thereof, particularly when taken in conjunction with the accompanying drawings wherein like reference numerals in the various figures are utilized to designate like components.

DETAILED DESCRIPTION

Figure 1:
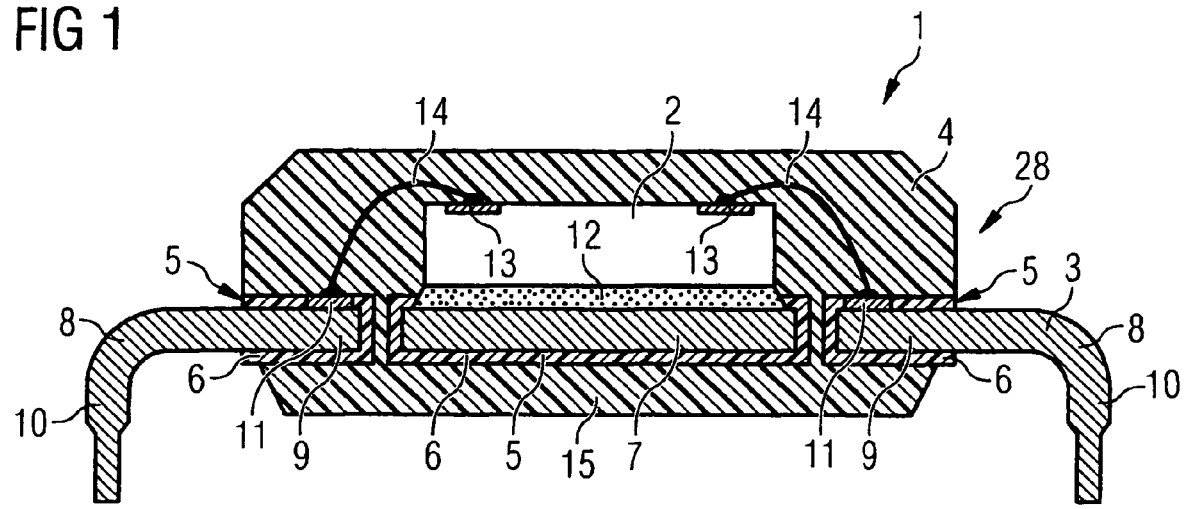
FIG. 1 shows a cross section of a semiconductor device with a selectively added buffer layer in accordance with a first embodiment of the invention.

A semiconductor device is provided in accordance with the invention. The semiconductor device includes semiconductor device components embedded in plastic package compound. The surfaces of the semiconductor device components at least in part include a buffer layer which is arranged between the semiconductor device components and the plastic package housing. The buffer layer at least in part comprises a thermoplastic material.

The buffer layer with thermoplastic material is preferably elastic and viscoelastic. The thermoplastic material of the buffer layer can become soft and flow repeatedly at temperatures above its glass transition temperature. Consequently, the thermoplastic material can flow into cracks and bubbles which are formed between the semiconductor device components and the plastic package compound. This function is not provided in conventional adhesion promoter layers. The action of the buffer layer of the invention is therefore different than in the case of conventional adhesion promoter layers, which are designed on the basis of improved mechanical anchoring or improved chemical bonds.

Following the occurrence of cracks in semiconductor devices in which an adhesion promoter layer has been put on the embedded components, these cracks cannot be rehealed. Attempts are therefore normally made to improve the adhesion between the semiconductor device components and the plastic package compound using an improved adhesion promoter layer. This can be provided by a porous layer, so that the mechanical anchoring is improved. Alternatively, this can be provided with polymers that include particular chemical terminal groups having a special affinity for the materials of the device components.

In contrast thereto, the invention provides a semiconductor device which has a self-healing mechanism. Cracks form at increased temperatures due to the different expansion coefficients of the device's materials. Thermoplastic materials have the property that they can flow repeatedly at temperatures above their glass transition temperatures. If cracks appear at the boundary between the chip island of a flat conductor frame and the plastic package compound during the test process, for example, these cracks can be filled by the flow of the softened thermoplastic material of the buffer layer. This means that the cracks in the device of the invention can be formed and healed during the test process. Thus, the present invention produces not just a crack-free device but also a device in which cracks produced at a later time are healed automatically.

Another advantage is that the thermoplastic material can also prevent the cracks from propagating, which means that the reliability of the device is increased during the rest of the test process and in operation. A stable and reliable device is therefore provided.

Still another advantage of the semiconductor device of the invention is that the buffer layer can be arranged on all surfaces of the semiconductor device components made from the widest possible variety of materials, which means that it forms a moisture and corrosion resistant boundary layer between metal surfaces, ceramic surfaces and/or other plastic surfaces of the semiconductor devices and the material of the plastic package compound, which comprises an epoxy resin, for example. The buffer layer can also be put on system carriers which include a ceramic plate or a printed circuit board with an appropriately patterned metal coating.

In one embodiment, the thermoplastic material has a glass transition temperature (Tg) of no greater than 150° C. This thermoplastic material becomes soft and thus flows at temperatures of no greater than 150° C. and is suitable for applications in which the maximum test temperature is 150° C. This allows the thermoplastic material to become soft and to fill cracks which occur during the test process. A crack-free device can be delivered to the customer.

In another embodiment, the thermoplastic material has a glass transition temperature (Tg) of less than 120° C. This material has the advantage that it can flow at the typical autoclave temperature of 121° C.

The thermoplastic material may advantageously have a melting temperature (Tm) of more than 260° C. 260° C. is the maximum soldering temperature which is used for lead-free solder, and is typically the maximum temperature which puts a strain on the device and which the device is intended to endure. The thermoplastic material of the buffer layer with a melting temperature of more than 260° C. is therefore stable when the device is soldered on a superordinate printed circuit board.

The thermoplastic material can comprise polyamides such as Polyamide 66 and Polyamide 46, polyphenylene sulfide, polyethylene terephthalate, polyaryl ether ketone, polyether ether ketone, polycarbonates or copolymers and/or combinations of any of these compounds.

The buffer layer can have an average thickness D of between 2 nm$\leq$D$\leq$10 µm, preferably 2 nm$\leq$D$\leq$300 nm, preferably 2 nm$\leq$D$\leq$50 nm. The thickness may be selected such that the coverage of the surface can be optimized for a particular material and coating technique. This makes the effect of the buffer layer more reliable.

In another embodiment, the buffer layer also includes an adhesion promoter. This embodiment has the advantage that improved adhesion to the plastic package compound and the semiconductor device components is provided at the same time as the aforementioned advantages of voltage equalization and crack healing action.

In one embodiment, the adhesion promoter is incorporated in the structure of the thermoplastic material. This has the advantage that only one layer is put on the surfaces of the semiconductor devices which are to be embedded. This simplifies the production process and reduces production costs.

In another embodiment, the adhesion promoter is put on the thermoplastic material in the form of a coating. This has the advantage that combinations of thermoplastic materials and adhesion promoters can be provided which are not compatible in terms of structure.

The adhesion promoter can comprise epoxy, polyimide, polyacrylate, a metal oxide or a semiconductor oxide. Mixtures of these substances are also conceivable as adhesion promoters. These materials have the advantage that they have suitable properties for use as adhesion promoter layers in semiconductor devices.

In another embodiment of the invention, the porosity of the buffer layer increases gradually from a nonporous coating on the surfaces of the semiconductor device components to a microporous morphology in the transition region to the plastic package compound. The gradual increase in the porosity from an initially closed buffer layer to a microporous morphology for the surface protects the surface of the semiconductor device components against boundary face corrosion in the metal/plastic composite, while the gradual increase in the porosity with the thickness of the buffer layer intensifies the interlocking with the plastic package compound. In this context, the material of the adhesion promoters with the polymeric plastic package compound enters into complex bonds. This internal structure of the adhesion promoters likewise further reduces stresses in the boundary faces.

In another preferred embodiment of the invention, the semiconductor device includes, as semiconductor device component, a wiring substrate including a patterned metal coating. Such wiring substrates can have the buffer layers applied to them in the region of the patterned metal coating using the previously known technologies, while the insulating surface regions cannot be coated by electrolysis using the conventional methods, unless a thin, shorting, metal coating for the entire wiring substrate is risked. However, this conflicts with such a wiring substrate's purpose that the patterned metal coating needs to be used to produce connecting lines and interconnects between various elements of the semiconductor device. In the buffer layer of the invention, both the region of the wiring substrate, which is nonconductive, and the region of the substrate with a patterned metal coating can be provided with a buffer layer fully and constantly.

In another embodiment of the invention, the semiconductor device includes, as a semiconductor device component, a ceramic substrate with patterned metal layers. Such multilayer ceramic substrates are used for designing semiconductor devices in radio-frequency engineering. It is possible for the buffer layer to be used to provide even the ceramic surfaces of the semiconductor device component with a buffer layer fully.

In addition, semiconductor device can be provided with, as a semiconductor device component, a printed circuit board with a patterned metal coating. Regions of the insulating plate can be coated with the buffer layer in exactly the same way as the patterned metal coating on the printed circuit board, which means that an intensive connection to the plastic package compound covering the printed circuit board becomes possible.

In another embodiment of the invention, a system carrier is provided including a plurality of semiconductor device positions which are arranged in succession and/or one after the other in rows and/or columns. Such system carriers are used for holding semiconductor device components on a three-dimensional wiring structure with internal contact areas for electrical connections to a semiconductor chip. The surfaces of the system carrier selectively include a buffer layer which at least in part comprises a thermoplastic material. The internal contact areas of the system carrier remain free of the adhesion promoter layer.

The buffer layer per se corresponds in terms of its composition and in terms of its morphology to the buffer layer as has already been described in detail above in relation to application with semiconductor device components. Accordingly, the system carrier can include a ceramic substrate or a wiring substrate with a patterned metal coating or a printed circuit board with a patterned coating. The system carrier on the surfaces which come into contact with plastic package compound during production of the semiconductor devices can be selectively coated with an inventive buffer layer.

In particular, this is the case when the system carrier includes internal flat conductors with internal contact pads. These internal flat conductors change into external flat conductors and are held by a system carrier frame for the system carrier. In this arrangement, the flat conductor frame can include a flat conductor strip with a large number of semiconductor device positions arranged in succession.

The surfaces of the internal flat conductors include the buffer layer on them, the composition and structure of which have already been described in detail above. However, the internal contact areas, the external flat conductors and the system carrier frame remain free of the buffer layer. A system carrier of this kind is a precursor for the production of semiconductor devices and can be produced as a precursor by companies supplying the semiconductor industry.

In another embodiment of the system carrier with a selectively arranged buffer layer, the system carrier includes a perforation along one system carrier frame in order to position it in a component fitting machine. This provides the advantage that a large number of semiconductor devices can be produced in automatic fashion on a strip-like system carrier of this kind.

In addition, the system carrier can include a metal alloy plating made of silver and/or of a solder alloy, preferably on the internal contact areas. The contact pads not only remain free of the adhesion promoter layer but are themselves covered by a coating which aids a soldering or bonding operation.

In another embodiment of the invention, the base material of the system carrier is made of high-purity copper and/or a copper alloy, which are advantageous as a result of their high level of electrical conductivity.

A method for producing a system carrier for semiconductor devices includes the following method steps. First of all, a substrate plate including at least one metal surface is patterned to produce a system carrier. During patterning, a plurality of successive patterns are produced for holding semiconductor device components in semiconductor device positions. The surfaces of the system carrier, which form a boundary face with a plastic package compound during production of semiconductor devices, are then coated with a buffer layer. The buffer layer at least in part comprises a thermoplastic material.

In another embodiment, surface regions which are to be kept free are covered with a protective layer before the system carrier is coated with buffer layer. After the coating, this protective layer may advantageously be swelled, so that it can be removed with the overlapping one on the surface regions which are to be kept free.

In another embodiment, the surface regions which are to be kept free are exposed again only after the surfaces of the system carrier have been coated with buffer layer. In this embodiment, before exposure the surface regions on which the buffer layer is intended to remain can be protected. The surface regions can be exposed using laser cutting or using plasma etching methods.

A method for producing a plurality of semiconductor devices using a system carrier with a plurality of semiconductor device positions is described as follows. First of all, a system carrier is provided including a selectively added buffer layer on its surfaces. The selectivity relates to the fact that only the surface regions of the system carrier which are intended to form a boundary layer with a plastic package compound are covered with a buffer layer. Contact pads for electrical connections and/or chip pads for making contact with a semiconductor chip are kept free of the adhesion promoter layer.

The semiconductor device components, such as semiconductor chips, are now put onto a system carrier of this kind in the semiconductor device positions, connecting the semiconductor chips to contact pads of the system carrier by electrical connecting elements. When all the semiconductor device components have been put onto the system carrier, the semiconductor device components are embedded into a plastic package compound. Finally, the system carrier can then be split into individual semiconductor devices.

The system carrier itself may be a printed circuit board with a metal structure or a multilayer ceramic plate or a metal flat conductor frame. The advantage of this method is that the buffer layer is applied independently of the material of the semiconductor device components. It is thus possible to provide metal flip chip contacts, and also metal bonding wires, with a buffer layer in exactly the same way as the surfaces of the semiconductor chip and the surfaces of the system carrier. This property of the buffer layer is applied particularly when, before the semiconductor device components are embedded into a plastic package compound, the as yet uncoated surfaces of semiconductor device components are likewise intended to be coated with the buffer layer.

In an alternative method for producing semiconductor devices using a system carrier, it is also possible to use a system carrier which does not include any kind of buffer layer at first. In a first step, semiconductor device components, such as semiconductor chips, are put onto the system carrier in semiconductor device positions, connecting the semiconductor chips to contact pads on the system carrier for electrical connections. Only then is a buffer layer made of thermoplastic material put onto all the surfaces of the semiconductor device components which are to be embedded into a plastic package compound. The semiconductor device components which have now been provided with a buffer layer are then embedded into a plastic package compound.

Finally, the system carrier can be split into individual semiconductor devices. The semiconductor manufacturer assembles all the semiconductor device components on a conventional carrier substrate and then applies the buffer layer onto the surfaces of these semiconductor device components. An advantage of this alternative method is that none of the surfaces which are to be covered with a plastic package compound are free of a buffer layer.

The invention will now be explained in more detail with reference to the exemplary embodiments depicted in the figures.

FIG. 1 shows a cross section of a semiconductor device 1 which includes a semiconductor chip 2 and a flat conductor frame 3. The regions of the flat conductor frame 3 which are embedded in a plastic package compound 4 are coated with a buffer layer 5. The buffer layer 5 comprises a thermoplastic material 6, (e.g., Polyamide 66).

The flat conductor frame 3 includes a chip island 7 and a plurality of flat conductors 8 which surround the chip island 7. Each flat conductor includes an internal region 9 which is embedded within the plastic package compound 4 of the device 1 and an external region 10 which remains outside of the plastic compound 4. The external regions 10 of the flat conductors 8 provide the external contacts of the semiconductor device, which can be used to assemble the semiconductor device 1 on a superordinate printed circuit board. The internal region 9 of each flat conductor 8 includes an internal contact area 11. The flat conductor frame 3 comprises copper (Cu) and the internal contact areas 11 comprise a nickel/nickel phosphorus (Ni/NiP) layer.

The passive reverse of the semiconductor chip 2 is assembled on the chip island 7 above an adhesive layer 12. The active top of the semiconductor chip 2 includes integrated circuits, which are not shown in FIG. 1, and chip contact areas 13. The chip contact areas 13 are electrically connected to the flat conductors 8 by bonding wires 14. The bonding wires 14 respectively extend between a chip contact area 13 and an internal contact area 11.

The semiconductor chip 2, the bonding wires 14, the chip island 7 and the internal regions 9 of the flat conductors 8 are embedded in a plastic package compound 4. The plastic package compound 4 comprises epoxy resin 15.

As noted above, the internal regions 9 of the flat conductor frame 8, which are embedded within the plastic package compound 4, are coated with a buffer layer 5 made of a thermoplastic material 6. The internal contact areas 11 and also the central region of the chip island 7, on which the semiconductor chip 2 is assembled, remain free of the buffer layer 5.

In this embodiment, a flat conductor frame 3 selectively coated with the buffer layer 5 is provided. The semiconductor chip 2 is assembled on the chip island 7 and bonding wires 14 between the chip contact areas 13 and the internal contact areas of the flat conductors 8 are produced. The semiconductor chip 2, the bonding wires 14 and the regions of the flat conductor frame 3 which are coated with the buffer layer 5 are embedded in a plastic package compound 4 in order to produce the semiconductor device 1.

The buffer layer 5 is applied to the flat conductor frame 3 by dipping of portions of the frame into a buffer material before the device is assembled. Previously, the internal contact areas 11 and the external regions 10 of the flat conductors 8 have been covered with a protective layer, so that these regions remain free of the thermoplastic material 6 of the buffer layer 5.

Cracks may form due to the widely different expansion coefficients of the metal flat conductor frame and of the plastic package compound. Cracks therefore form at increased temperatures, such as during the manufacturer's test process or during soldering attachment. A buffer layer made of thermoplastic material has the advantage that the thermoplastic material softens at increased temperature and can flow. Consequently, cracks in the inventive device which occur during the test process can also be filled and healed during the test process.

The buffer layer 5 made of a thermoplastic material 6 provides an advantage that, at temperatures above the glass transition temperature of the thermoplastic material 6, the thermoplastic material 6 can repeatedly soften and flow. Polyamide 66 has a glass transition temperature of approximately 80° C., which is lower than the maximum temperature which is achieved during the test process. When a crack or a split occurs between the metal flat conductor frame 8 and the plastic package compound 4 during the test process, the thermoplastic material 6 can fill the crack or the split.

Table 1 (set forth below) shows various thermoplastic materials which are suitable for the inventive buffer layer 5. Each material has a glass transition temperature of no greater than 150° C. and a melting temperature of at least 260° C.

TABLE 1

| Thermoplastic material | Glass Transition Temperature Tg (° C.) | Melting Temperature Tm (° C.) |
|---|---|---|
| Polyamide 66 (PA66) | 80 | 265 |
| Polyamide 46 (PA46) | 85 | 295 |
| Polyphenylene sulfide (PPS) | 85 | 285 |
| Polyethylene terephthalate (PET) | 98 | 290 |
| Polyaryl ether ketone (PAEK) | 140 | 380 |
| Polyehter ether ketone (PEEK) | 145 | 380 |
| Polycarbonate (PC) | 150 | 260 |

A glass transition temperature (Tg) of no greater than 150° C. provides the advantage that the thermoplastic material softens and flows at typical maximum test temperatures. A melting temperature of more than 260° C. provides the advantage that the thermoplastic material remains stable when the device is soldered on.

Figure 2:
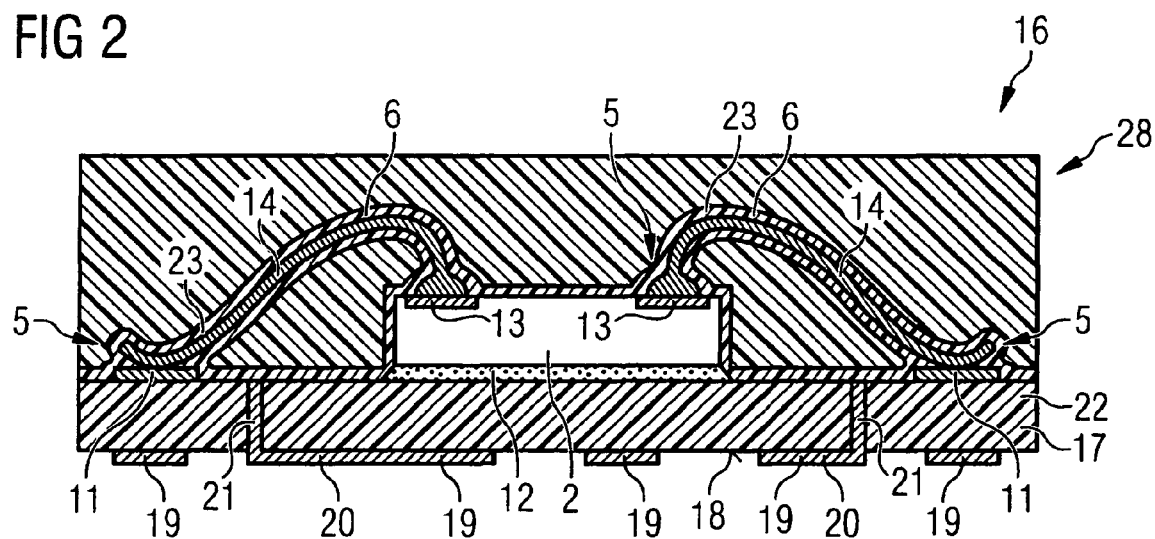
FIG. 2 shows a cross section of a semiconductor device in accordance with a second embodiment of the invention, in which the surfaces of the embedded components are coated fully with a buffer layer.

FIG. 2 shows a semiconductor device 16 in accordance with a second embodiment of the invention. In this embodiment, the semiconductor device 16 includes a rewiring substrate 17. The substrate 17 includes internal contact areas 11 comprising copper on its top and external contact areas 19 on its bottom. The internal contact areas 11 are electrically connected to the external contact areas 19 by interconnects 20 and plated-through connections 21. The interconnects 20 and plated-through connections 21 form the rewiring structure of the substrate 17. In this exemplary embodiment, the substrate 17 includes a dielectric layer 22. The interconnects are arranged on the top and on the bottom of the dielectric layer 22.

The reverse of the semiconductor chip 2 is mounted on the top of the substrate 17 by a mounting layer 12. The chip contact areas 13 are electrically connected to the internal contact areas 11 by bonding wires 14. The chip contact areas 13 comprise aluminum and the bonding wires 14 comprise gold.

In the exemplary embodiment which can be seen in FIG. 2, all embedded surfaces of the semiconductor device components 28 are coated with a buffer layer 5.

In this embodiment, semiconductor components 28 refer to components which are embedded in the plastic package. In the embodiment in FIG. 2, the semiconductor components 28 are the semiconductor chip 2, the bonding wires 14 and the top of the rewiring substrate 17. Consequently, the surfaces of the bonding wires, of the semiconductor chip 2 and of the top of the rewiring substrate 17 are covered with the buffer layer 5.

In this exemplary embodiment, the buffer layer 5 comprises a thermoplastic material and also an adhesion promoter component 23. The adhesion promoter component is held in the structure of the thermoplastic material. The adhesion promoter component 23 improves the adhesion between the thermoplastic material 6 and the plastic package compound 4 and also between the embedded semiconductor components and the plastic package compound 4. In this exemplary embodiment, the adhesion promoter is polyimide. The surface of the bonding wires 14, of the semiconductor chip 2 and of the top of the rewiring substrate 17 are coated with the buffer layer 5. This can be done by spraying or dipping.

A device 16 is produced using the following method in accordance with the invention. The semiconductor chip 2 is assembled on the top of the substrate 17 using a mounting layer 12. The bonding wire connections 14 between the chip contact areas 13 and the internal contact areas 11 of the substrate 17 are produced so that the semiconductor chip 2 is electrically connected to the substrate 17. A buffer layer 5 is applied to the surfaces of the bonding wires, of the semiconductor chip 2 and of the top of the rewiring substrate 17 so that the surface is covered fully with the buffer layer 5.

Next, the coated semiconductor chip 2, the coated bonding wires 14 and the coated top of the substrate 17 are embedded in a plastic compound 4. External contacts can then be put onto the external contact areas so that the device 16 can be assembled on a printed circuit board. The device 16 can be tested.

Figure 3:
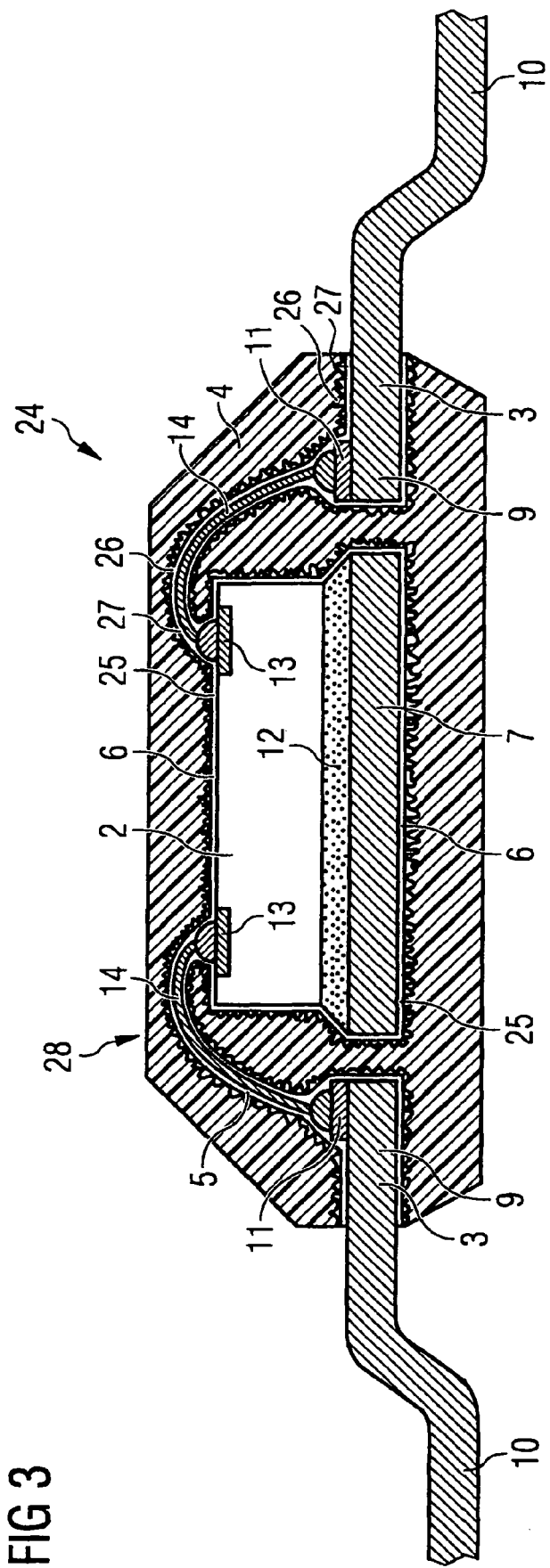
FIG. 3 shows a cross section of a semiconductor device in accordance with a third embodiment of the invention, in which the buffer layer includes an adhesion promoter.

FIG. 3 shows a schematic cross section through a semiconductor device 24 with a flat conductor frame 3 in which the surfaces of the embedded semiconductor components are coated fully with a buffer layer 5. In this embodiment, the buffer layer 5 includes a first layer 25 made of a thermoplastic material 6 and a second layer 26 which comprises an adhesion promoter 27. The adhesion promoter 27 is thus arranged on the thermoplastic material 6.

In the embodiment in FIG. 3, the semiconductor components 28 are the semiconductor chip 2, the bonding wires 14, the chip island 7 and the internal regions 9 of the flat conductors 8.

The adhesion promoter layer 27 comprises a metal oxide which in this embodiment provides a porous rough surface. The rough surface improves the mechanical anchoring between the embedded components 28 and the plastic package compound 4.

The additional adhesion promoter layer 27 provides the advantage that the adhesion between the plastic package compound 4 and the thermoplastic material 6 and also between the plastic package compound 4 and the flat conductor frame 3 and the other embedded components is improved. This arrangement also reduces the risk of crack formation on account of the adhesion promoter 27 and simultaneously provides a mechanism in which cracks which have occurred can be filled with the thermoplastic material.

The surface adhesion between the surfaces of the semiconductor device components 3 in the plastic package compound 4 is improved by virtue of all semiconductor device components 3 having been provided with the buffer layer 5 following their assembly on the flat conductor frame 3. Only then are the surfaces coated with a layer 25 made of thermoplastic material 6. An adhesion promoter layer 26 is then put on the thermoplastic layer 25.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. A semiconductor device comprising:
   semiconductor device components embedded in a plastic package compound, wherein the semiconductor device components include bonding wires; and
   a buffer layer coating the bonding wires of the semiconductor device components and other surface portions of the semiconductor device components embedded within the plastic package compound, wherein the buffer layer comprises a thermoplastic material that has a glass transition temperature (Tg) of no greater than 150° C., and the buffer layer coats and provides an interface between the plastic package compound and all exposed surface portions of semiconductor device components and bonding wires that are embedded in the plastic package compound.

2. The semiconductor device of claim 1, wherein the thermoplastic material has a glass transition temperature (Tg) of less than 120° C.

3. The semiconductor device of claim 1, wherein the thermoplastic material has a melting temperature (Tm) of more than 260° C.

4. The semiconductor device of claim 1, wherein the thermoplastic material comprises at least one of a polyamide, polyphenylene sulfide, polyethylene terephthalate, polyaryl ether ketone, polyether ether ketone, polycarbonate and copolymers thereof.

5. The semiconductor device of claim 1, wherein the buffer layer has an average thickness D of between $2\text{ nm} \leq D \leq 10\text{ μm}$.

6. The semiconductor device of claim 1, wherein the buffer layer has an average thickness D of between $2\text{ nm} \leq D \leq 300\text{ nm}$.

7. The semiconductor device of claim 1, wherein the buffer layer has an average thickness D of between $2\text{ nm} \leq D \leq 50\text{ nm}$.

8. The semiconductor device of claim 1, wherein the buffer layer further comprises an adhesion promoter.

9. The semiconductor device of claim 8, wherein the adhesion promoter is incorporated in the thermoplastic material.

10. The semiconductor device of claim 8, wherein the adhesion promoter comprises a coating on the thermoplastic material.

11. The semiconductor device of claim 8, wherein the adhesion promoter comprises at least one of an epoxy, a polyimide, a polyacrylate, a metal oxide, a semiconductor oxide and mixtures thereof.

12. A semiconductor device comprising:
    semiconductor device components embedded in plastic package compound; and
    a buffer layer coating at least surface portions of the semiconductor device components embedded within the plastic package compound, wherein the semiconductor components include bonding wires and the buffer layer coats and provides an interface between the plastic package compound and exposed surface portions of semiconductor device components including bonding wires that are embedded in the plastic package compound, the buffer layer comprises a thermoplastic material and a porosity of the buffer layer gradually increases from being nonporous at a portion of the interface that engages the surfaces of the semiconductor device components to having a microporous morphology at a portion of the interface that engages with the plastic package compound.

13. The semiconductor device of claim 1, wherein a semiconductor device component of the semiconductor device comprises a wiring substrate including a patterned metal coating.

14. The semiconductor device of claim 1, wherein a semiconductor device component of the semiconductor device comprises a ceramic substrate including patterned metal layers.

15. The semiconductor device of claim 1, wherein a semiconductor device component of the semiconductor device comprises a flat conductor frame including a chip island and internal flat conductors that extend outside of the outside of the plastic package compound as external flat conductors including external contacts.

16. The semiconductor device of claim 1, wherein a semiconductor device component of the semiconductor device comprises a semiconductor chip.

17. The semiconductor device of claim 1, wherein a porosity of the buffer layer changes from being nonporous at the surfaces of the semiconductor device components to having a microporous morphology at an interface with the plastic package compound.

18. The semiconductor device of claim 1, wherein the buffer layer further extends between upper surface portions of the semiconductor device components and the plastic package compound.

19. A system carrier comprising a plurality of semiconductor device positions arranged in succession in rows and/or columns and a three-dimensional wiring structure including internal contact areas and bonding wires to electrically connect to semiconductor chips and to hold semiconductor device components, wherein selected surface portions of the system carrier and the bonding wires are coated with a buffer layer comprising a thermoplastic material that has a glass transition temperature (Tg) of no greater than 150° C., the internal contact areas are free of the buffer layer, and the buffer layer coats surface portions of the system carrier and bonding wires such that, when semiconductor chips are provided in the semiconductor device positions and the semiconductor chips and bonding wires are embedded in a plastic package compound, the buffer layer provides an interface between the plastic package compound and all exposed surfaces disposed within the plastic package compound.

20. The system carrier as claimed in claim 19, wherein the thermoplastic material has a glass transition temperature (Tg) of less than 120° C.

21. The system carrier of claim 19, wherein the thermoplastic material has a melting temperature (Tm) of more than 260° C.

22. The system carrier of claim 19, wherein the thermoplastic material comprises at least one of a polyamide, polyphenylene sulfide, polyethylene terephthalate, polyaryl ether ketone, polyether ether ketone, polycarbonate and copolymers thereof.

23. The system carrier as claimed in claim 19, wherein the system carrier further comprises internal flat conductors on which the internal contact areas are disposed, the internal flat conductors extend to external flat conductors that are held by a system carrier frame, the system carrier frame comprises a flat conductor strip upon which the plurality of semiconductor device positions are arranged, the buffer layer is disposed on surfaces of the internal flat conductors, and the external flat conductors and the system carrier frame are free of the buffer layer.

24. The system carrier of claim 23, wherein the system carrier includes a perforation along one system carrier frame in order to position the system carrier in a component fitting machine.

25. The system carrier of claim 19, wherein the system carrier further comprises a metal alloy plating on the internal contact areas.

26. The system carrier of claim 19, wherein the system carrier comprises at least one of copper and a copper alloy.

27. The system carrier of claim 19, wherein a porosity of the buffer layer changes from being nonporous at the surface portions of the system carrier to having a microporous morphology at an interface with the plastic package compound.

* * * * *